June 4, 1963

J. BAUDE 3,091,939

THERMOELECTRIC COOLER CIRCUIT WITH THERMAL ELECTRIC FEED-BACK ARRANGEMENT

Filed Oct. 2, 1961

Inventor

John Baude

By Warren F. B. Lindsley

Attorney

United States Patent Office 3,091,939 Patented June 4, 1963

3,091,939

THERMOELECTRIC COOLER CIRCUIT WITH THERMAL ELECTRIC FEED-BACK ARRANGEMENT

John Baude, Milwaukee, Wis., assignor to Allis-Chalmers Manufacturing Company, Milwaukee, Wis.
Filed Oct. 2, 1961, Ser. No. 142,417
14 Claims. (Cl. 62—3)

This invention relates to electric circuits and more particularly to new and improved thermoelectric cooling circuits.

Thermoelectric coolers utilizing the Peltier phenomenon have been known and are sold commercially. Types WX814 and WX816 are presently sold by the Westinghouse Electric Corporation. These coolers are intended for use as electronic component coolers and for other applications where compactness, silent operation with no moving parts, and a controllable cooling rate is desired. The cooler produces or absorbs heat at the junction of two materials upon the passage of a current therethrough. Heat generated by the passage of the current in one direction will be absorbed if the current is reversed. The characteristics of the coolers utilizing the Peltier phenomenon is nonlinear, i.e. an increasing cooling current therethrough when the temperature difference at the hot and cold areas of the cooler decreases. This means that in order to obtain linear temperature control of the cooler the cooling current therethrough must rise faster than the temperature difference of the relatively hot and relatively cold surfaces of the cooler.

In order to obtain a linear control of a thermoelectric cooler utilizing the Peltier effect a new and improved thermoelectric cooling circuit is provided comprising a source of electric power. A current controlling device is connected in series with a cooling member comprising two complementary heat generating and absorbing materials across the source of electric power. The cooler is exposed to two temperature conditions or zones. A sensing device is arranged to sense at least one of the temperature conditions. Means are provided for connecting the sensing device to the controlling device across a source of electric power. The sensing device is affected by the temperature of the conditions or zones to control the flow of current through the controlling device and the cooler.

It is, therefore, one object of this invention to provide a new and improved circuit for a thermoelectric cooler.

Another object of this invention is to provide a new and improved circuit for a thermoelectric cooler utilizing the Peltier effect.

A further object of this invention is to provide a new and improved circuit for a thermoelectric cooler in which the nonlinear temperature current characteristic of the cooler is compensated for to provide a linear temperature current characteristic of the circuit.

A still further object of this invention is to provide a new and improved circuit for a thermoelectric cooler utilizing the Peltier effect in which the leakage current of one or more diodes renders the temperature current characteristic of the circuit linear.

Objects and advantages other than those set forth will be apparent from the following description when read in connection with the accompanying drawing, in which.

Figures 1, 2, 3, 4:
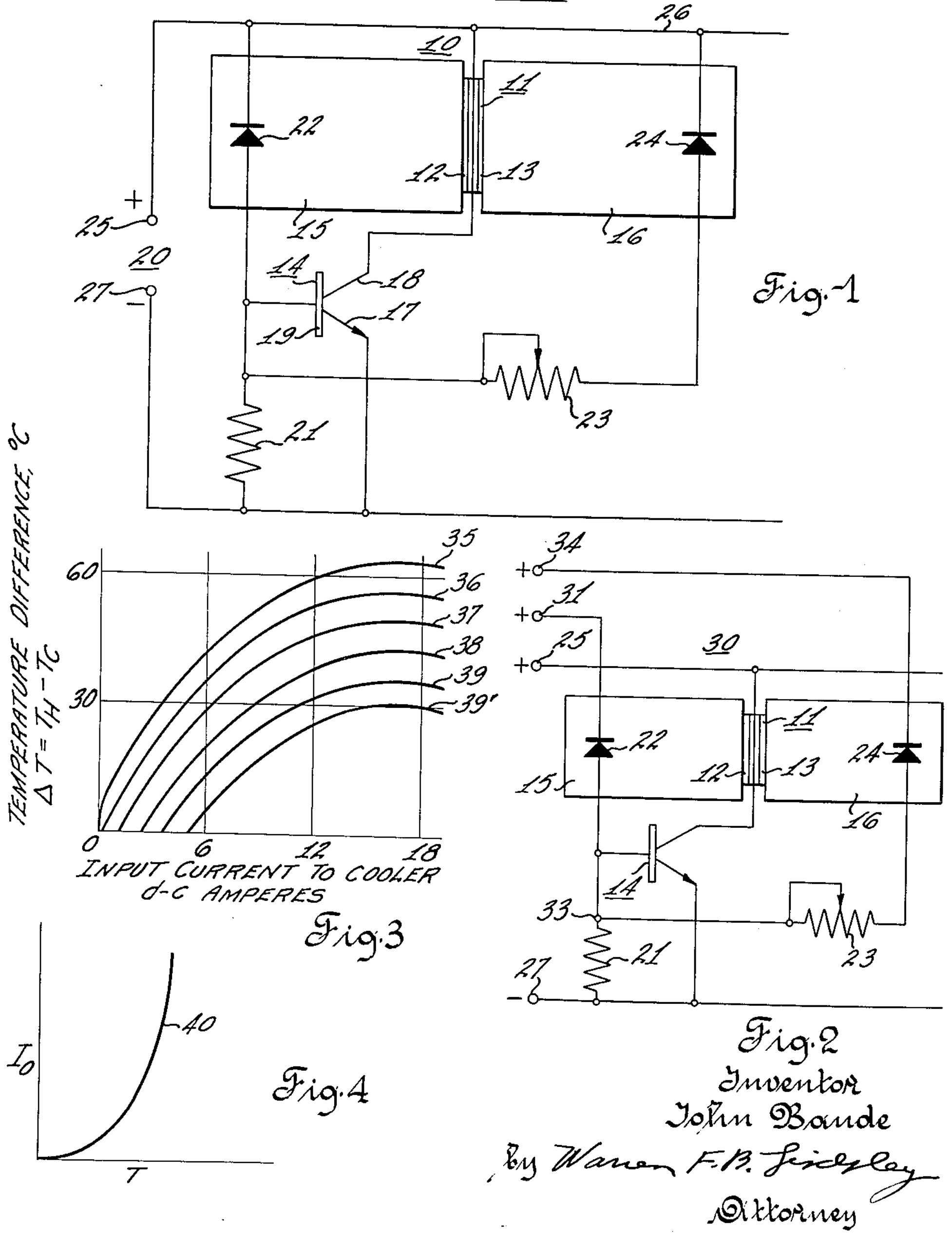
FIG. 1 is a circuit diagram of a new and improved circuit for a thermoelectric cooler employing the Peltier effect and embodying the invention.
FIG. 2 is a modification of the circuit illustrated in FIG. 1.
FIG. 3 is a diagram illustrating graphically the temperature difference versus input current for various constant heat pumping capacities of the thermoelectric cooler utilized.
FIG. 4 is a diagram illustrating the temperature leakage current characteristics of germanium diodes.

Referring more particularly to the drawing wherein like parts are designated by like characters of reference throughout the figures, FIG. 1 illustrates a thermoelectric cooler circuit 10 comprising a member 11 having two complementary heat generating and absorbing materials 12 and 13, respectively. Member 11 is a device utilizing the Peltier phenomenon for removing heat from a confined area by means of current circulating through a current controlling device such as, for example, a vacuum tube or a semiconductor, i.e. transistor 14. The Peltier effect is defined as the production or absorption of heat at the junction of two metals on the passage of a current. The cooling action of such a thermoelectric device is a function of current flow and therefore can be regulated. Member 11 is constructed in such a manner that one side or zone thereof removes heat by cooling and the other side of the member radiates heat into a second zone. Consequently, the device will have a cool area or zone 15 and hot area or zone 16 during its operation.

Transistor 14 comprising an emitter electrode 17, collector electrode 18 and base electrode 19 has its emitter electrode and collector electrode connected in series with member 11 across a source of electric power such as, for example, a direct current source 20. Base electrode 19 of transistor 14 is connected between a resistor 21 and a temperature sensing device such as diode 22 which are connected in series arrangement across the direct current source of power 20. Diode 22 is arranged within the cooling or cold area or zone 15. An adjustable resistor 23 and a temperature sensing device such as diode 24 are connected in series arrangement to the positive terminal 25 of source 20 through a conductor 26 and between resistor 21 and diode 22 in their series arrangement across the negative terminal 27 and the positive terminal 25 of source 20. Diode 24 is arranged within the heating or hot area or zone 16.

FIG. 2 illustrates a modification of the structure shown in FIG. 1 wherein the thermoelectric circuit 30 employing the same circuit components as shown and described in FIG. 1 differs therefrom by connecting the series arrangement of resistor 21 and diode 22 to a different source of direct current between the ground terminal 27 and a positive terminal 31. Resistor 23 and diode 24 are connected between point 33 in the series arrangement between resistor 21 and diode 22 and a positive terminal 34 of a different source of direct current. Thus, FIG. 2 shows the use of more than one source of electric power for controlling the thermoelectric cooler.

As noted from FIGS. 1 and 2 the base current of transistor 14 is controlled by the parallel arrangement of the sensing diodes 22 and 24. These may be, for example, germanium diodes which pass leakage current in their blocking direction with an exponentially increasing characteristic on increasing temperature as graphically shown in curve 40 of FIG. 4 wherein time T is the abscissa and current $I_0$ is the ordinate. These diodes may also be replaced with thermisters or transistors of various characteristics to achieve a desired deviation from a linear characteristic.

In FIGS. 1 and 2 we illustrate hot and cold zones between which is placed the thermoelectric cooler 10. This cooler may be, if so desired, embedded in a semiconductor device such as an overcurrent relay with its cold side and diode 22 exposed to the parts which need to be cooled and its hot side and diode 24 exposed to the atmosphere. If diode 22 in the cold zone, i.e. the zone associated with, for example, a critical semiconductor circuit or device, is exposed to an increasing temperature above the desired maximum temperature point it will start to pass more than a given leakage current. This increase in leakage current through diode 22 is directed into base 19 of transistor 14 and is amplified causing the cooling current flowing from source 20 through member 11 and the collector and emitter electrodes of transistor 14 to increase. This increase current through member 11 will start to cool zone 15 in which diode 22 is located.

Because of the nonlinear current temperature characteristics of the thermoelectric cooler member 11, shown in FIG. 3, an access of cooling current is needed to compensate for a given temperature increase in the cold zone 15. In FIG. 3 curves 35, 36, 37, 38, 39 and 39′ illustrate the temperature difference versus input current for the various constant heat pumping capacities of the type WX816 thermoelectric cooler defined. These curves are identified as 0.0 watts (0.0 B.t.u./hr.), 1.0 watt (3.41 B.t.u./hr.), 2.0 watts (6.82 B.t.u./hr.), 3.0 watts (10.25 B.t.u./hr.), 4.0 watts (13.65 B.t.u./hr.) and 5.0 watts (17.1 B.t.u./hr.) respectively Therefore, the second sensing device, diode 24, is desired and is located in the hot zone 16. Diode 24 senses the increase in the temperature in the hot zone due to the increased leakage current through diode 22 and the resulting increased cooling current through member 11 and by means of its increasing leakage current through it and resistor 23 increases further the base current through transistor 14 in excess of the amount supplied by diode 22 located in the cold zone 15. The leakage currents of diodes 22 and 24 are added to each other and applied to base 19 of transistor 14.

In this manner a thermoelectric feed-back effect is produced and with proper selection of the individual characteristics of the two sensing devices, for example, diodes 24 and 22 as well as the proper adjustment of resistor 23, the cooling current through member 11 can be controlled to obtain compensation for the nonlinear characteristics of member 11, shown in FIG. 4, and constant temperature obtained in the cold zone 15. In fact it is possible with the circuits of FIGS. 1 and 2 to overcompensate for special purposes, if so desired. It will be recognized that as the cold zone becomes colder with the increased current flow through member 11, diode 22 in the cold zone passes less leakage current and thus the base current of transistor 14 is reduced thereby reducing the current flow through member 11. The reduced temperature of the hot zone 16 also decreases the base current of transistor 14 and this reduced current further reduces the current flow through member 11. The reduction and increase of current flow through member 11 with temperature variations is provided in a linear manner with the operation of diodes 22 and 24 functioning as explained.

Instead of using germanium diodes 22 and 24, it is possible to use other devices such as thermisters with a greater current carrying ability. FIGS. 1 and 2 show the circuit with only one transistor, but it is conceivable that the thermoelectric cooler current requirements may exceed the current rating of a particular type of transistor and amplification may be required where more than one transistor would be used.

Figure 5:
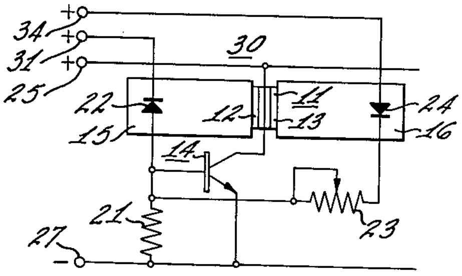
FIG. 5 is a modification of the structure shown in FIG. 2 wherein the temperature sensing device senses the temperature difference in two zones.

FIG. 5 illustrates a modification of the structure shown in FIG. 2 wherein the circuit components are the same as shown in FIG. 2 and bear the same reference characters. Terminal 34 is rendered more negative than terminal 31 and diode 24 is reversed. In this embodiment the leakage currents are subtracted one from the other and the difference is applied to base 19 of transistor 14.

Although but a few embodiments of the present invention have been illustrated and described, it will be apparent to those skilled in the art that various changes and modifications may be made therein without departing from the spirit of the invention or from the scope of the appended claims.

Having now particularly described and ascertained the nature of my said invention and the manner in which it is to be performed, I declare that what I claim is:

1. A thermoelectric cooling circuit comprising a source of electric power, a member comprising two complementary heat generating and absorbing materials, a current controlling device responsive to an electrical condition connected to said member and said source, said member being exposed to two temperature conditions, temperature sensing devices arranged to sense said conditions, means for connecting said sensing devices to said controlling device and to a source of electric power, said sensing devices being affected by the temperature of said conditions to control the electrical condition of said controlling device to control the flow of current through said controlling device and said member.

2. A thermoelectric cooling circuit comprising a source of electric power, a member comprising two complementary heat generating and absorbing materials, a current controlling device connected in series with said member across said source, said member being exposed to two temperature conditions, sensing devices arranged to sense each of said conditions, means for connecting said sensing devices to said controlling device and across a source of electric power, said sensing devices, having electrical characteristics responsive to the temperature differences of said conditions to control the flow of current through said controlling device and said member.

3. A thermoelectric cooling circuit comprising a source of electric power, a member comprising two complementary heat generating and absorbing materials, a current controlling device responsive to an electrical condition connected in series with said member across said source, said member being exposed to two temperature conditions, a first means comprising a pair of temperature sensing devices one arranged to sense each of said conditions, a second means for connecting said first means to said controlling device and across said source, said first means having electrical characteristics responsive to the temperature difference of said conditions to control the electrical condition of said controlling device to control the flow of current through said controlling device and said member.

4. A thermoelectric cooling circuit comprising a source of electric power, a member comprising two complementary heat generating and absorbing materials, a current controlling device responsive to current flow connected in series with said member across said source, said member being exposed to two temperature conditions, a pair of temperature sensing devices one arranged to sense each of said conditions, means for connecting said sensing devices to said controlling device and across a source of electric power, said sensing devices varying current flow in response to the temperature of said conditions to control the current flow to said controlling device to control the flow of current through said controlling device and said member.

5. A thermoelectric cooling circuit comprising a source of electric power, a member comprising two complementary heat generating and absorbing materials, a current controlling device responsive to an electrical current connected in series with said member across said source, said member being exposed to two temperature conditions, a pair of temperature sensing devices one arranged to sense each of said conditions, means for individually connecting said sensing devices to said controlling device and across a source of electric power, said sensing devices varying current flow to said controlling device in response to the temperature of said conditions to individually control the flow of current through said controlling device and said member.

6. A thermoelectric cooling circuit comprising a source of electric power, a member comprising two complementary heat generating and absorbing materials, a current controlling device responsive to current flow connected in series with said member across said source, said member being exposed to two temperature conditions, a pair of temperature sensing devices one arranged to sense each of said conditions, means for connecting said sensing devices to said controlling device and across said sensing source, said devices having an impedance variable in response to the temperature of said conditions to control the flow of current through said controlling device and said member.

7. A thermoelectric cooling circuit comprising a first source of electric power, a member comprising two complementary heat generating and absorbing materials, a semiconductor for controlling the current through said member in response to an electrical condition, said semiconductor connected in series with said member across said first source, said member being exposed to two temperature zones, a pair of temperature sensing devices one arranged in each of said zones, means for individually connecting said sensing devices to said semiconductor and across a second source of electric power, said sensing devices individually being affected by the temperature of said zones to individually control the electrical condition of said semiconductor to control the flow of current through said semiconductor and said member.

8. A thermoelectric cooling circuit comprising a first source of electric power, a member comprising two complementary heat generating and absorbing materials, a transistor connected to said member and said first source to control the current flow to said member, said member being exposed to two temperature zones, a pair of diodes one arranged in each of said zones, means for individually connecting said diodes to said transistor and to a second source of electric power, said diodes individually being affected by the temperature of said zones to individually control the flow of current through said transistor and said member.

9. A thermoelectric cooling circuit comprising a source of electric power, a member comprising two complementary heat generating and absorbing materials, a transistor comprising a base electrode, an emitter electrode and a collector electrode, said emitter electrode and said collector electrode being connected in series with said member across said source, said member being exposed to two temperature zones, a pair of diodes arranged one in each of said zones, means for individually connecting said diodes to said base electrode and across a source of electric power, said diodes individually being affected by the temperature of said zones to individually control the flow of current through said transistor and said member.

10. A thermoelectric cooling circuit comprising a source of electric power, a member comprising two complementary heat generating and absorbing materials, a transistor comprising a base electrode, an emitter electrode and a collector electrode, said emitter electrode and said collector electrode being connected in series with said member across said source, said member being exposed to two temperature zones, a pair of diodes, one arranged in each of said zones, means for individually connecting said diodes to said base electrode and across a source of electric power, the leakage current of said diodes being affected by the temperature of said zones to individually control the flow of current through said transistor and said member.

11. A thermoelectric cooling circuit comprising a source of electric power, a member comprising two complementary heat generating and absorbing materials having a nonlinear temperature current characteristics, a transistor comprising a base electrode, an emitter electrode and a collector electrode, said emitter electrode and said collector electrode being connected in series with said member across said source, said member being exposed to two temperature zones, a pair of germanium diodes one arranged in each of said zones, means for individually connecting said diodes to said transistor and across a source of electric power, said diodes having an exponentially increasing leakage current with temperature characteristic, said diodes being individually affected by the temperature of said zones to individually control the flow of current through said transistor and said member.

12. A thermoelectric cooler, the cooling action of which is a function of current flow, a circuit for current flow through said cooler including an electrically responsive control element and means for varying the response of said element with the temperature of said cooler, said means including a control effecting circuit for varying the electrical condition of said means and temperature sensing and current varying elements in the hot zone and the cold zone of said cooler arranged to provide thermoelectric feedback varying the electrical condition of said means and the current flow through said cooler.

13. A device utilizing the Peltier phenomenon for removing heat from a confined area in combination with a circuit for current flow through said device, said circuit including a current responsive control element, and a control effecting circuit for varying the current flow to said element, said last circuit including temperature sensing and current varying elements in the hot zone and the cold zone of said device arranged to provide thermoelectric feedback varying the current flow to said element to control the current flow through said device.

14. A member displaying the Peltier phenomenon for removing heat from a confined area and producing a hot zone and a cold zone in combination with a circuit for controlling current flow through said member, said circuit including an electrically responsive control element for varying the current flow through said member, and a control effecting circuit for controlling the electrical condition of said element including temperature sensing elements in the hot zone and in the cold zone of said member for varying the electrical condition of said circuit in response to the temperatures of said zones to control the current flow through said member.

References Cited in the file of this patent

UNITED STATES PATENTS

| | | |
|---|---|---|
| 2,964,655 | Mann | Dec. 13, 1960 |
| 2,998,707 | Meess | Sept. 5, 1961 |
| 3,031,855 | Martz | May 1, 1962 |